United States Patent
Handl et al.

(10) Patent No.: US 7,582,965 B2
(45) Date of Patent: Sep. 1, 2009

(54) ELECTRONIC DEVICE AND METHOD FOR BONDING AN ELECTRONIC DEVICE

(75) Inventors: Herbert Handl, Nuremberg (DE); Alexander Wenk, Burgoberbach (DE); Matthias Wieczorek, Neunkirchen am Sand (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 173 days.

(21) Appl. No.: 10/586,942

(22) PCT Filed: Dec. 14, 2004

(86) PCT No.: PCT/DE2004/002731

§ 371 (c)(1),
(2), (4) Date: Jul. 24, 2006

(87) PCT Pub. No.: WO2005/074341

PCT Pub. Date: Aug. 11, 2005

(65) Prior Publication Data

US 2007/0158840 A1    Jul. 12, 2007

(30) Foreign Application Priority Data

Jan. 29, 2004 (DE) .................. 10 2004 004 422

(51) Int. Cl.
*H01L 23/12* (2006.01)
(52) U.S. Cl. .............. 257/733; 257/E21.512; 257/731; 257/727; 257/737; 361/751; 361/757; 174/16.3

(58) Field of Classification Search .......... 257/E23.105, 257/727, 737, E21.512, E21.525, 679, 664, 257/676, 731–733; 361/707, 783, 704, 751, 361/757; 349/58, 150; 310/353, 324, 344; 165/185, 80.3; 174/16.3, 562
See application file for complete search history.

(56) References Cited

U.S. PATENT DOCUMENTS

| | | | | |
|---|---|---|---|---|
| 4,042,861 A * | 8/1977 | Yasuda et al. | ............... | 361/783 |
| 4,148,183 A * | 4/1979 | Murakami | ................. | 368/159 |
| 4,405,875 A * | 9/1983 | Nagai | ......................... | 310/344 |
| 4,725,924 A * | 2/1988 | Juan | ........................... | 361/751 |
| 4,903,114 A | 2/1990 | Aoki et al. | ..................... | 357/70 |
| 5,571,027 A | 11/1996 | Roebuck et al. | ............. | 439/264 |
| 5,713,563 A * | 2/1998 | Chan | .......................... | 269/27 |
| 5,847,572 A | 12/1998 | Iwasaki et al. | ............. | 324/755 |
| 5,933,327 A * | 8/1999 | Leighton et al. | ............ | 361/719 |
| 6,058,013 A * | 5/2000 | Christopher et al. | ........ | 361/704 |
| 6,099,109 A * | 8/2000 | Komuro | ..................... | 347/50 |
| 6,373,128 B1 | 4/2002 | Karavakis et al. | ............ | 257/678 |
| 7,259,502 B2 * | 8/2007 | Kami et al. | ................. | 310/353 |

FOREIGN PATENT DOCUMENTS

WO    WO 2004/001807    12/2003

* cited by examiner

*Primary Examiner*—Chris C Chu
(74) *Attorney, Agent, or Firm*—W. F. Fasse; W. G. Fasse

(57) ABSTRACT

An electronic device (1) has a base plate (2) and an electronics housing (3) connected thereto, with a bonding contact terminal (5). The latter is supported relative to the base plate (2) via a supporting body (6) in such a manner that the supporting body (6) exerts a pre-stressing force onto the bonding contact terminal (5). Due to this support of the bonding contact terminal (5), its position is well defined during the bonding procedure. A secure bond is the result.

17 Claims, 2 Drawing Sheets

ELECTRONIC DEVICE AND METHOD FOR BONDING AN ELECTRONIC DEVICE

FIELD OF THE INVENTION

The invention relates to an electronic device including a housing connected to a base plate. Furthermore, the invention relates to a procedure for electrically bonding an electronic device.

BACKGROUND INFORMATION

An electronic device of the above mentioned general type is known from prior public use. In the known device, the electronics housing is supported on the base plate by a supporting rib in the vicinity of the bonding contact terminal, which is also called a bond contact bearer herein. Through processing tolerances, in particular through unevennesses in the base plate or supporting rib, it is possible that the electronics housing is not in contact with the base plate via the supporting rib, at least in certain areas. As a result, in these areas, the electronics housing is not supported in the vicinity of the bonding contact terminal, i.e. the bond contact bearer. Due to this inadequate support, the position of the bond contact bearer is only imprecisely defined. The insufficient support of the bond contact bearer results in its tendency to vibrate during bonding. In order to ensure a bond connection, it must be possible to set a second, so-called "secure bond", which itself requires additional space. For this reason, the bond contact bearers must be relatively large in size, in order to guarantee secure bonding.

SUMMARY OF THE INVENTION

It is therefore the object of the present invention to further develop an electronic device of the above-mentioned type in such a manner, that greater security in the production of a bond connection is provided.

This object is achieved according to the invention in an electronic device with the inventive features disclosed and claimed herein. The device further includes a supporting body that supports the bonding contact terminal relative to the base plate in such a manner so that the supporting body exerts a pretension force onto the bonding contact terminal (i.e. the so-called "bond contact bearer").

The supporting body according to the invention ensures that the bond contact bearer is supported in a pretensioned state on the base plate. The at least one bond contact bearer is then securely supported by the supporting body, so that its position is clearly defined. Due to the pretensioned support, in particular the tendency of the at least one bond contact bearer to vibrate is avoided. As a result, it is possible to work with more compact bond contact bearers. If appropriate, a second, so-called secure bond is not required, which makes the design of the bond contact bearer even more compact. If several adjacent bond contact bearers are present, the bonding grid can therefore be smaller, which leads to a more compact bond area in the electronics housing.

A projection height of the supporting body above the base plate is preferably greater than the distance between the bonding contact terminal and the base plate before assembly of the supporting body therebetween. This results in secure pretensioning without high production costs.

A supporting body embodied as a distinct component that is separate from the base plate and mechanically connected to the housing enables pretensioned support even with different combinations of base plates and electronics housings, adapting the size of the supporting body to the electronics housing on the one hand and to the distance between the bonding contact terminal or bond contact bearer and the base plate on the other hand. The mechanical connection between the supporting body and the electronics housing can in particular be created by means of latching.

A supporting body can be realized as a projecting ring, or as plural projecting segments. Such a supporting body can be simply aligned to the electronics housing. The realization of the supporting body as a plurality of projecting individual segments enables a high degree of flexibility in the design of the supporting body. An adaptation to a very wide range of geometries in the base plate on the one hand, and the electronics housing on the other, is possible. The individual segments can in particular be latched onto the electronics housing, which guarantees a good position definition of the supporting body.

The invention further aims to provide a procedure for securely providing an electrical bond connection. The advantages of the procedure according to the invention correspond to those which are described above in connection with the electronic device according to the invention.

BRIEF DESCRIPTION OF THE DRAWINGS

An exemplary embodiment of the invention will be described below in greater detail with reference to the drawings, in which.

DETAILED DESCRIPTION OF AN EXAMPLE EMBODIMENT OF THE INVENTION

Figure 1:
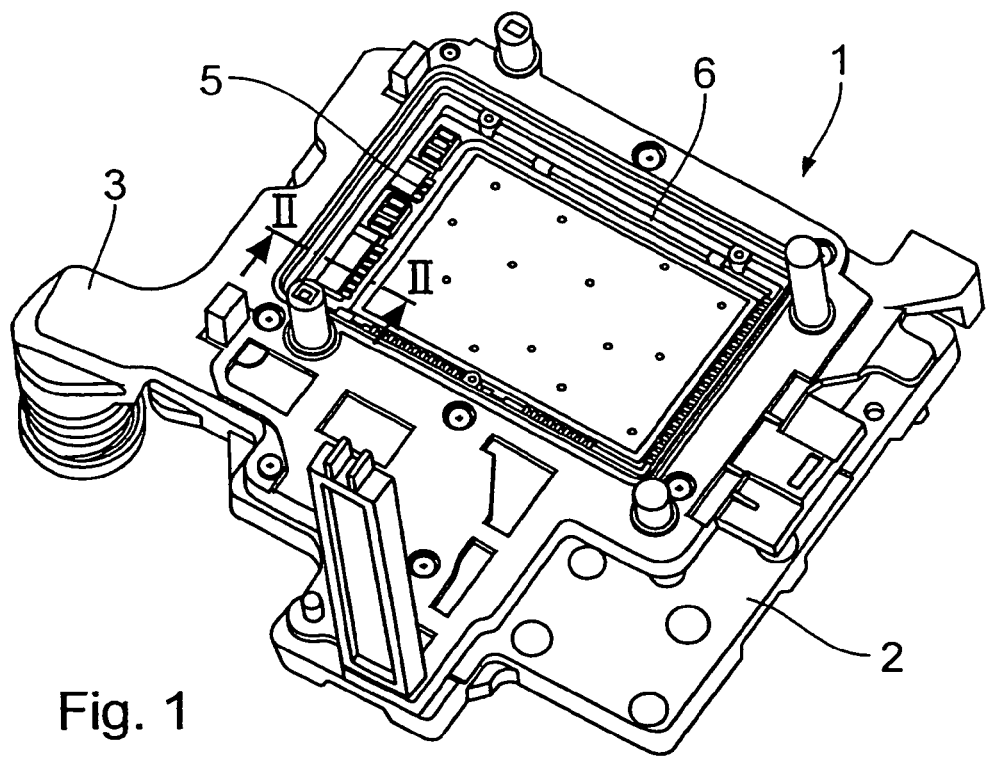
FIG. 1 shows a perspective view of an electronic device according to the invention.

FIG. 1 shows a perspective view of an electronic device 1, which is designed to be contacted with a further electronic component, in this case, a chip. The electronic device 1 comprises a base plate 2, which supports an electronics housing 3. The base plate 2 is glued to the electronics housing 3. The electronics housing 3 is supported on the base plate 2 by, for example, a supporting rib 4. The latter is arranged in the vicinity of a plurality of bonding tongues 5 on the electronics housing 3. The bonding tongues 5 serve as bonding contact terminals or bond contact bearers to establish the electrical contact between the electronics housing 3 and the additional electronic component, not shown in the drawing.

Figure 2:
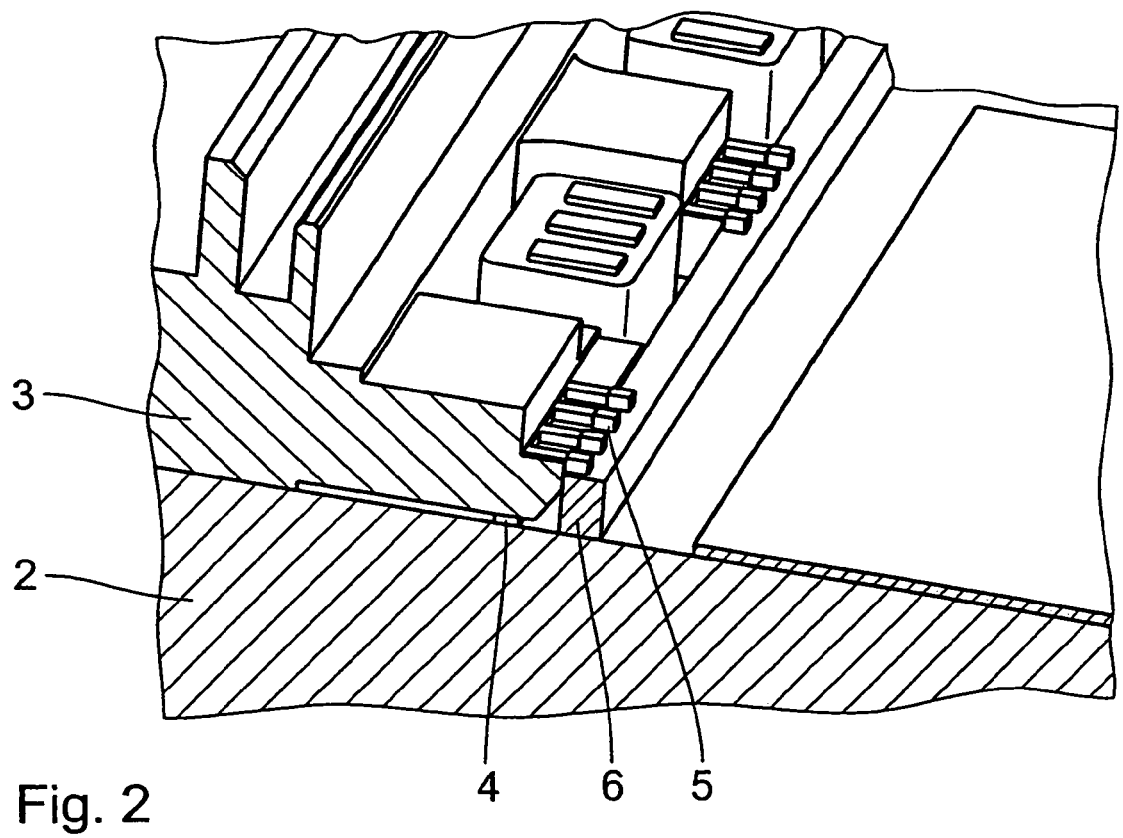
FIG. 2 shows a perspective view of a section corresponding to line II-II in FIG. 1.
Figure 3:
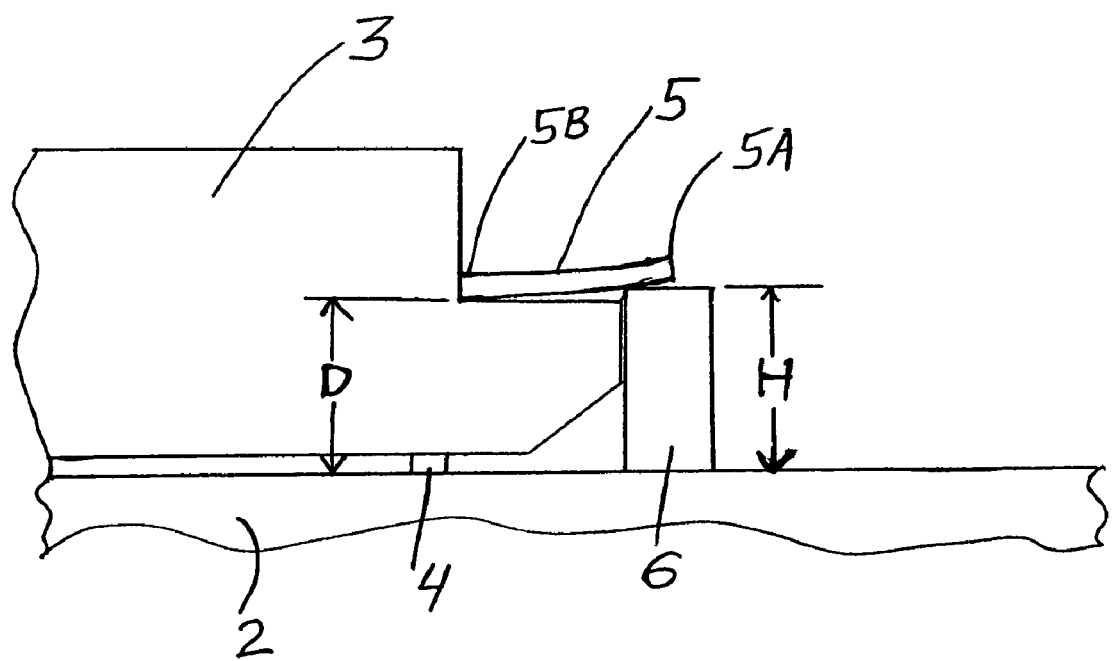
FIG. 3 is an enlarged schematic diagram of a side view of a partial area of FIG. 2.

As further shown in FIGS. 2 and 3, each bonding tongue 5 has a free terminal end 5A projecting from the housing 3, and opposite the free terminal end 5A, a root end 5B at which the bonding tongue 5 adjoins the housing 3. The free terminal ends 5A of the bonding tongues 5 rest on, i.e. are supported relative to, the base plate 2 via a supporting body 6. The latter is designed as a peripheral supporting frame in the form of a ring, which runs around the periphery in an approximately rectangular form, and which lies on the base plate 2. The supporting body 6 is a component which is separate from the base plate 2. The height H of the supporting body 6 above the base plate 2, i.e. its projection above the base plate 2, is greater than the initial pre-assembly distance D between the bonding tongues 5 and the base plate 2. This excess dimension of H greater than D is very slight, and causes the supporting body 6 to upwardly deflect the free terminal ends 5A of the bonding tongues 5, and thereby to exert a pre-stressing or pretension force onto the bonding tongues 5 which it supports.

When the electronic device 1 is to be electrically bonded with bond contact bearers or terminals of the additional electronic component, the procedure is as follows. First the supporting body 6 is mechanically connected, e.g. latched, to the electronics housing 3. Then, the electronics housing 3 is positioned onto the base plate 2 and glued to it. Due to this connection, the supporting body 6 deflects the bonding tongues 5 and thereby exerts a pretension force onto the bonding tongues 5. In this state, the free ends 5A of the deflected bonding tongues 5 rest on the supporting body 6 at the height H above the base plate 2, while the root ends 5B of the bonding tongues 5 still adjoin the housing 3 at the distance D above the base plate 2, thereby giving rise to the above-mentioned pre-stressing force. Then, a bond connection is produced between the bonding tongues 5 of the electronics housing 3 and a further bond contact terminal of the at least one additional component.

Alternatively, the supporting body can be designed as a plurality of individual segments which project above the base plate 2, i.e. it can be designed from several individual supporting segments, which are latched or snapped onto the electronics housing 3.

The invention claimed is:

1. An electronic device
  with a base plate,
  with an electronics housing which is connected to the base plate, with at least one bond contact terminal,
characterized in that the bond contact terminal has a bond contact area adapted to establish an electrical bond connection, and the bond contact terminal is supported on the base plate by a supporting body in such a manner that the supporting body exerts a pretension force onto the bond contact terminal, and the supporting body is arranged and positioned so that the bond contact area of the bond contact terminal is located in an area of the supporting body projecting in a direction in which the supporting body exerts the pretension force onto the bond contact terminal.

2. An electronic device according to claim 1, characterized in that a projection height of the supporting body above the base plate is greater than a distance between the bond contact terminal and the base plate in a pre-assembly condition without yet having the pretension force exerted by the supporting body onto the bond contact terminal.

3. A procedure for bonding the electronic device according to claim 1, comprising the steps:
  providing the base plate,
  connecting the electronics housing via the supporting body with the base plate in such a manner that the supporting body exerts the pretension force onto the bond contact terminal, and
  creating the electrical bond connection between the bond contact terminal of the electronics housing and an additional bond contact terminal of an additional electronic component.

4. An electronic device according to claim 1, characterized in that the supporting body represents a separate component from the base plate, which is mechanically connected to the electronics housing.

5. An electronic device according to claim 1, characterized in that the supporting body is designed as a projecting ring or as a plurality of projecting individual segments.

6. An electronic device according to claim 1, wherein the bond contact area is provided on a terminal end portion directly adjoining a free terminal end of the bond contact terminal, and the terminal end portion including the bond contact area is positioned and supported on the supporting body, and the free terminal end of the bond contact terminal does not project beyond the supporting body.

7. An electronic device according to claim 1, expressly omitting any electrical connection of the bond contact terminal to an additional electronic component at a location away from the supporting body.

8. An electronic device according to claim 1, wherein the supporting body supports the bond contact terminal so as to prevent a vibrating deflection of the bond contact terminal at the bond contact area.

9. An electronic device according to claim 1, wherein said supporting body contacts a surface of said bond contact terminal directly opposite said bond contact area at a location directly opposite said bond contact area.

10. An electronic device comprising:
  a base plate;
  an electronics housing connected to said base plate;
  an electrical bonding contact terminal that protrudes from said housing, wherein said bonding contact terminal has a free terminal end that projects away from said housing and that includes a bond contact area adapted to establish an electrical bond connection, and wherein said bonding contact terminal further has a root end adjoining said housing opposite said free terminal end; and
  a support body that is interposed between said free terminal end including said bond contact area of said bonding contact terminal and said base plate, and that supports said free terminal end of said bonding contact terminal relative to said base plate, and that deflects said free terminal end of said bonding contact terminal away from said base plate and thereby exerts a pre-stressing force onto said bonding contact terminal because a projection height of said support body from said base plate is greater than a nominal distance between said free terminal end of said bonding contact terminal and said base plate in a pre-assembly condition without said support body yet interposed therebetween; and
  wherein said support body is arranged and positioned so that said bond contact area of said bonding contact terminal is located in an area of said support body projected in a direction in which said support body exerts said pre-stressing force onto said bonding contact terminal.

11. The electronic device according to claim 10, further comprising an electronic component having a second bonding contact terminal, which is electrically bonded to said bond contact area of said bonding contact terminal that protrudes from said housing.

12. The electronic device according to claim 10, wherein said support body is a discrete component separate from said base plate and is mechanically connected to said electronics housing and merely resting on said base plate.

13. The electronic device according to claim 10, wherein said support body is a support frame with a ring shape extending continuously along a perimeter of an opening of said housing.

14. The electronic device according to claim 10, wherein said free terminal end of said bonding contact terminal does not project beyond said support body.

15. The electronic device according to claim 10, expressly omitting any electrical connection of said bonding contact terminal to an additional electronic component at a location away from said support body.

16. The electronic device according to claim 10, wherein said support body supports said bonding contact terminal so as to prevent a vibrating deflection of said bonding contact terminal at said bond contact area.

17. The electronic device according to claim 10, wherein said support body contacts a surface of said bonding contact terminal directly opposite said bond contact area at a location directly opposite said bond contact area.

* * * * *